(12) United States Patent
Kim

(10) Patent No.: US 7,476,612 B2
(45) Date of Patent: Jan. 13, 2009

(54) METHOD FOR MANUFACTURING SEMICONDUCTOR DEVICE

(75) Inventor: Su Kon Kim, Chungbuk (KR)

(73) Assignee: Dongbu HiTek, Co., Ltd.

( * ) Notice: Subject to any disclaimer, the term of this patent is extended or adjusted under 35 U.S.C. 154(b) by 225 days.

(21) Appl. No.: 11/564,131

(22) Filed: Nov. 28, 2006

(65) Prior Publication Data

US 2007/0123038 A1 May 31, 2007

(30) Foreign Application Priority Data

Nov. 30, 2005 (KR) ...................... 10-2005-0115445

(51) Int. Cl.
*H01L 21/44* (2006.01)

(52) U.S. Cl. .................... 438/637; 438/622; 438/624; 438/631; 438/634; 438/692; 257/E21.012; 257/E21.058; 257/E21.269; 257/E21.525; 257/E21.596

(58) Field of Classification Search ................ 438/253, 438/255, 396, 622, 624, 631, 634, 637, 638, 438/692, 700, 782, 940; 257/E21.012, E21.053, 257/E21.058, 269, 525, 579, 596, 648

See application file for complete search history.

(56) References Cited

U.S. PATENT DOCUMENTS

| 5,532,188 | A | * | 7/1996 | Wright ..................... 438/631 |
| 5,840,627 | A | * | 11/1998 | Huggins ..................... 438/669 |
| 6,033,952 | A | * | 3/2000 | Yasumura et al. ........... 438/253 |
| 6,174,741 | B1 | * | 1/2001 | Hansch et al. ................ 438/14 |
| 6,251,774 | B1 | * | 6/2001 | Harada et al. ............... 438/637 |

* cited by examiner

*Primary Examiner*—Michael S Lebentritt
(74) *Attorney, Agent, or Firm*—Sherr & Vaughn, PLLC

(57) ABSTRACT

In embodiments, a method for manufacturing a semiconductor device may include forming a diffusion preventing layer on a semiconductor substrate having a conductive layer, forming an intermetallic insulating layer on the diffusion preventing layer, forming a trench photo resist layer formed above the intermetallic insulating layer of a first photo resist material, forming a via hole photo resist layer of a second photo resist material at an upper portion and a sidewall in a contact hole of the trench photo resist layer, etching the intermetallic insulating layer and the diffusion preventing layer using the via hole photo resist layer and the trench photo resist layer to substantially simultaneously form a via hole and a trench, and filling the via hole and the trench with a metal thin film to form a metal line.

11 Claims, 4 Drawing Sheets

METHOD FOR MANUFACTURING SEMICONDUCTOR DEVICE

The present application claims priority under 35 U.S.C. 119 and 35 U.S.C. 365 to Korean Patent Application No. 10-2005-0115445(filed on Nov. 30, 2005), which is hereby incorporated by reference in its entirety.

BACKGROUND

Embodiments relate to a method for manufacturing a semiconductor device.

A metal line of a semiconductor substrate may connect circuits formed in a semiconductor substrate to each other, for example through electrical connections between semiconductor devices and a pad connection. Such connection may be performed using a metal thin film such as aluminum, alloy thereof, or copper.

To connect a device electrode and a pad isolated by an insulating layer such as an oxide layer, the insulating layer may be selectively etched to form a contact hole. A metal plug to fill the contact hole may be formed, for example using a barrier metal and tungsten. Next, a metal thin film may be formed and patterned at an upper portion of the metal plug to form a metal line for connecting a device electrode and a pad to each other.

A photolithography process may be performed to pattern the aforementioned metal line. As semiconductor devices have become smaller, however, a critical dimension (CD) of the metal line has been reduced. Accordingly, it may be difficult to form a fine pattern of the metal line. Hence, a damascene process has been developed to more easily form a metal line having a fine pattern.

To make a metal line through a damascene process according to the related art, however, two (2) photolithography processes, three (3) etch processes, and two or three (2-3) ashing processes may be required.

Accordingly, the time required to fabricate a product may be lengthy, and may result in an increased cost. In addition, excess material may remain between processes, and that may deteriorate the reliability of a resulting semiconductor device.

SUMMARY

According to embodiments, a method for manufacturing a semiconductor device may simplify a manufacturing process of the semiconductor device and improve the reliability thereof.

In embodiments, a method for manufacturing a semiconductor device, may include forming a diffusion preventing layer on a semiconductor substrate having a conductive layer; forming an intermetallic insulating layer on the diffusion preventing layer; forming a trench photo resist layer formed above the intermetallic insulating layer, the trench photo resist layer having a contact hole and being formed of a photo resist material of a first polarity; forming a via hole photo resist layer at an upper portion and a sidewall in the contact hole of the trench photo resist layer, the via hole photo resist layer being formed of a photo resist material of a second polarity; etching the intermetallic insulating layer and the diffusion preventing layer using the via hole photo resist layer and the trench photo resist layer to form a via hole and a trench; and filling insides of the via hole and the trench with a metal thin film to form a metal line.

DETAILED DESCRIPTION OF EMBODIMENTS

FIGS. 1 through 7 are example cross-sectional drawings illustrating a method for manufacturing a semiconductor device according to embodiments.

Figure 1:
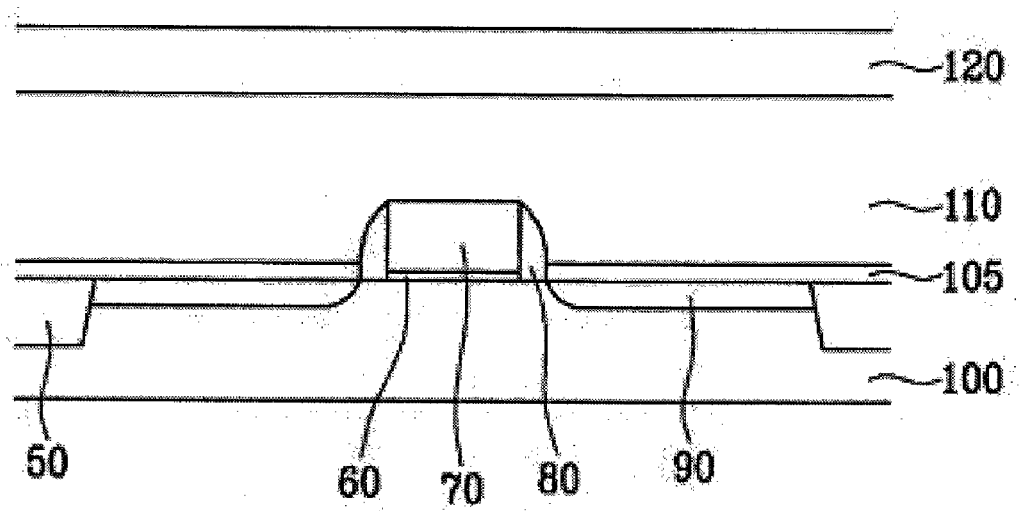
FIGS. 1 through 7 are example cross-sectional drawings illustrating a method for manufacturing a semiconductor device according to embodiments.

Referring to FIG. 1, gate insulating layer 60 and gate electrode 70 may be formed on semiconductor substrate 100, in which device isolation layer 50 and a high-density junction region may be formed. Spacer 80 may be formed at sidewalls of gate insulating layer 60 and gate electrode 70.

Diffusion preventing layer 105 may be formed on semiconductor substrate 100, and intermetallic insulating layer 110 may be formed on gate electrode 70 and spacer 80. First photo resist layer 120 may be formed on intermetallic insulating layer 110. In embodiments, first photo resist layer 120 may be a photo resist layer having a first polarity.

In embodiments, first photo resist layer 120 may be a photo resist layer having a positive polarity.

First photo resist layer 120 may be formed of a polyimide material having excellent etch preventing characteristics. In other words, first photo resist layer 120 may be highly etch-resistant.

Figure 2:
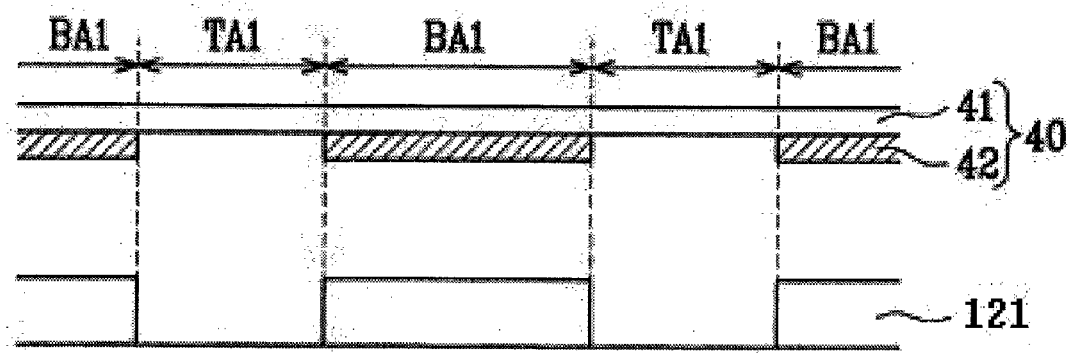
Figure 2:
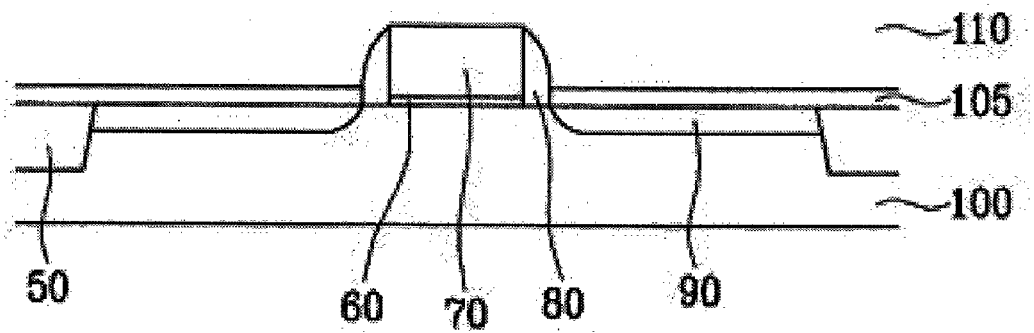

Referring to FIG. 2, trench photo resist layer 121 may be formed using first photo resist layer 120. For example, photo mask 40 may be aligned on first photo resist layer 120. Photo mask 40 may include transparent substrate 41 and first opaque light interruption layer 42, that may be formed under transparent substrate 41. Photo mask 40 may be divided into transmission area TA1 and shielding area BA1. First opaque light interruption layer 42 may be present in shielding area BA1 but absent in transmission area TA1.

Light may then be irradiated on to first photo resist layer 120 through photo mask 40. First photo resist layer 120 may be developed to remove a portion of first photo resist layer 120 exposed to light, for example having an intensity greater than a prescribed intensity. Accordingly, a portion of photo resist layer 120 facing transmission area TA1 may be removed, while a portion facing shielding area BA1 may remain. Trench photo resist layer 121 may thus be formed.

Figure 3:
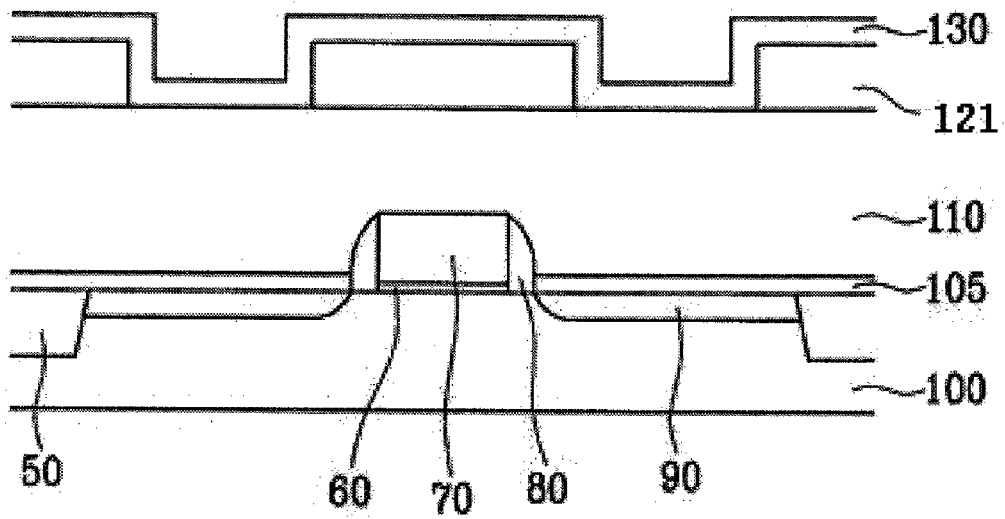

Referring to FIG. 3, second photo resist layer 130 may be formed on trench photo resist layer 121 and intermetallic insulating layer 110. In embodiments, second photo resist layer 130 may be formed of negative photosensitive organic substance. Second photo resist layer 130 may have an etch rate preventing rate less than that of first photo resist layer 120. That is, second photo resist layer 130 may be less etch resistant than first photo resist layer 120.

Figure 4:
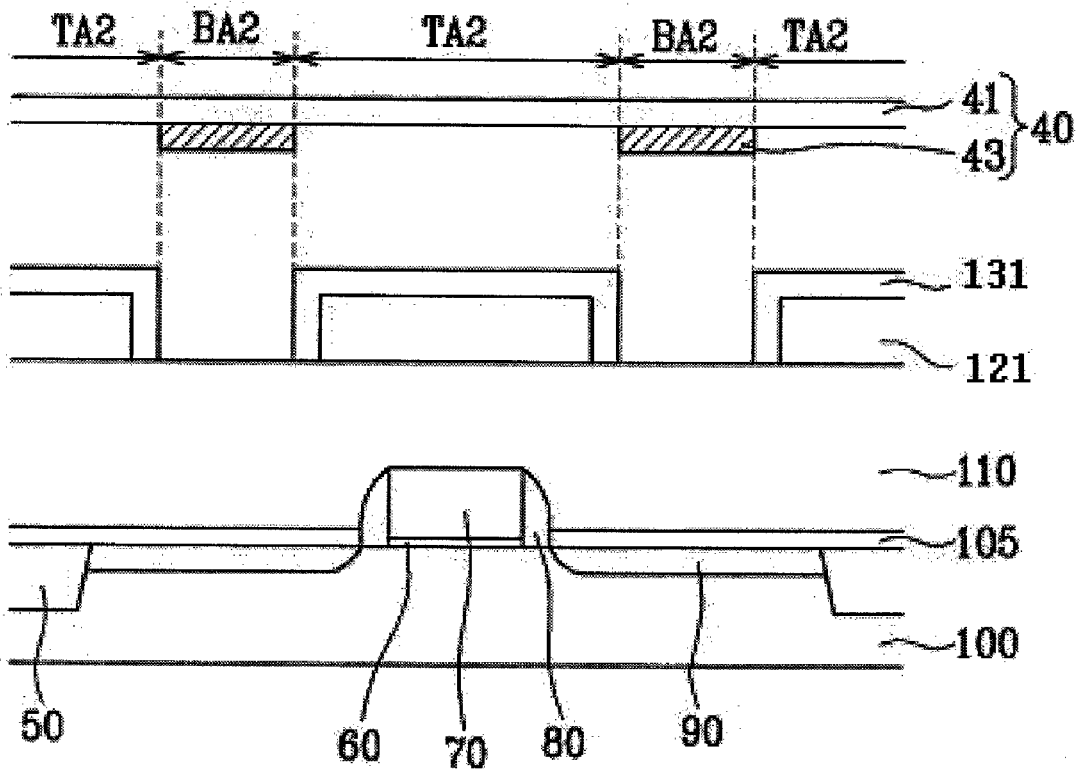

Referring to FIG. 4, photo mask 40 may be aligned above second photo resist layer 130. In embodiments, photo mask 40 may be the same as that used during formation of trench photo resist layer 121. In embodiments, photo mask 40 may be divided into transmission area TA2 and shielding area BA2. On the other hand, shielding area BA2 may exist in transmission area TA1 part of trench photo resist layer 121, and may have a width less than that of transmission area TA1.

Light may then be irradiated on to second photo resist layer 130 through photo mask 40. Second photo resist layer 130 may be developed to remove a portion facing shielding area BA1 while leaving a portion facing transmission area TA1. This may result in formation of via hole photo resist layer 131.

Figure 5:
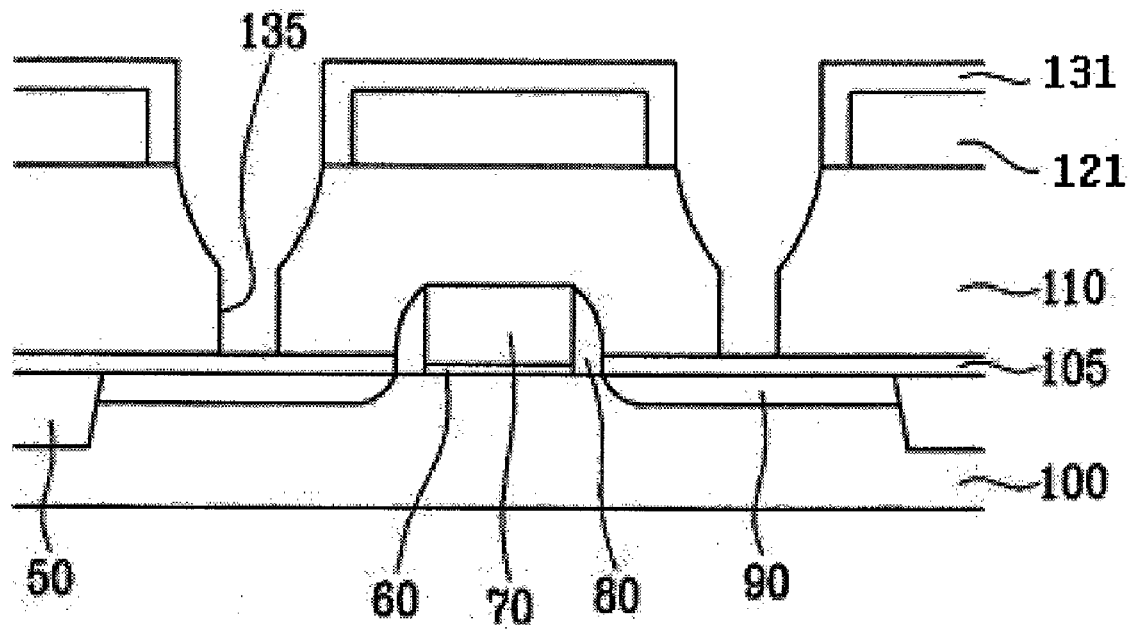

Referring to FIG. 5, an etch process may be performed using via hole photo resist layer 131 as a mask to form via hole 135. When the etch process is performed to form via hole 135, via hole photo resist layer 131 may be gradually etched.

Figure 6:
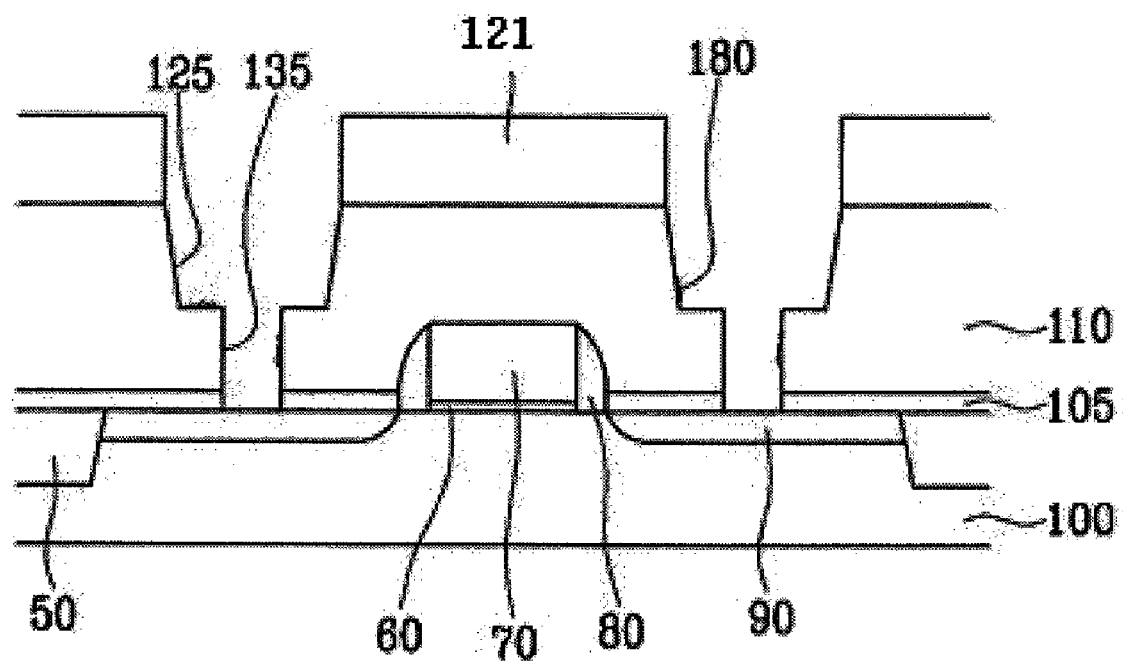

Referring to FIG. 6, via hole photo resist layer 131 may be removed. The etch process may be continuously carried out using trench photo resist layer 121 having an etching rate lower than that of via hole photo resist layer 131. In embodiments, trench 125 having a width greater than that of via hole 135 may be formed. Diffusion preventing layer 105 exposed through via hole 135 may be removed, so that semiconductor substrate 100 may be exposed. In embodiments, trench photo resist layer 121 may be made of polyimide materials, and may have a lower etching rate than that of via hole photo resist layer 131. In embodiments, the etching rate may be significantly lower.

In embodiments, via hole photo resist layer 131 and trench photo resist layer 121 having different characteristics may be formed. An etch process may be performed once using via hole photo resist layer 131 and trench photo resist layer 121 as a mask, so that via hole 135 and trench 125 may be substantially simultaneously formed. This may cause a process time of the semiconductor device to be reduced.

Next, an ashing process may be performed, for example in semiconductor substrate 100, to remove material 180 remaining at an inner wall of via hole 135 and/or trench 125. Accordingly, a reliability and characteristics of the semiconductor device may be enhanced.

Figure 7:
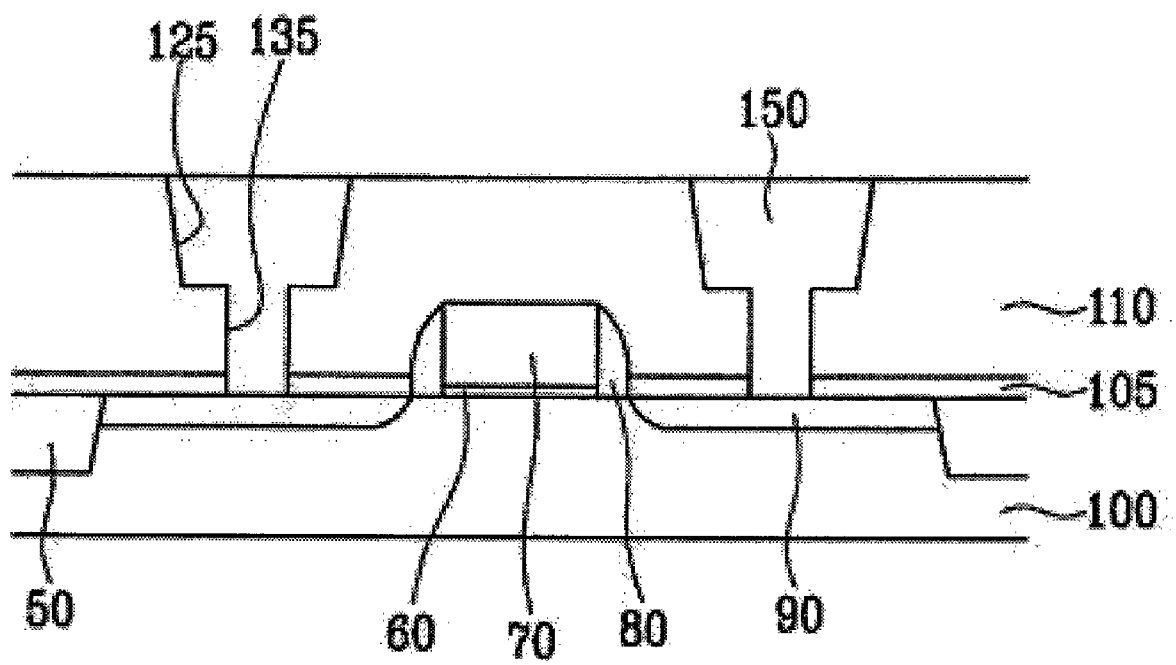

Referring to FIG. 7, via hole 135 and trench 125 may be filled with a metal thin film, and the resultant structure may be planarized through a chemical mechanism polishing to form metal line 150.

In related art, an etch process may be performed three times to form a metal line. In contrast to this, in embodiments, an etch process may be performed once using photo resist materials having different characteristics to simultaneously form a via hole and a trench. This may cause a fabrication process of a semiconductor device to be simplified and manufacturing cost to be reduced.

In addition, in embodiments, because a process may be simplified, an amount of remaining material that occurs during a process of forming the via hole and the trench may be reduced in comparison to the related art. Accordingly, the remaining material may be completely removed by performing an ashing process once. A reliability and characteristics of the semiconductor substrate may thus be improved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a diffusion preventing layer over a semiconductor substrate having a conductive layer;
   forming an intermetallic insulating layer over the diffusion preventing layer;
   forming a trench photo resist layer over the intermetallic insulating layer, the trench photo resist layer having a contact hole and comprising a first photo resist material of a first polarity;
   forming a via hole photo resist layer at an upper portion and a sidewall in the contact hole of the trench photo resist layer, the via hole photo resist layer comprising a second photo resist material of a second polarity; and
   etching the intermetallic insulating layer and the diffusion preventing layer using the via hole photo resist layer and the trench photo resist layer to form a via hole and a trench.

2. The method of claim 1, wherein the first photo resist material and the second photo resist material have an opposite polarity.

3. The method of claim 1, wherein the first photo resist material comprises a positive photo resist layer, and the second photo resist material comprises a negative photo resist layer.

4. The method of claim 1, wherein the via hole photo resist layer is more etch resistant than the trench photo resist layer.

5. The method of claim 1, wherein the trench photo resist layer has an etch speed faster than that of the via hole photo resist layer.

6. The method of claim 1, wherein the trench photo resist layer comprises polyimide materials.

7. The method of claim 1, wherein a transmission area of a photo mask for forming the via hole photo resist layer is narrower than that of a photo mask for forming the trench photo resist layer.

8. The method of claim 1, wherein the via hole and the trench are formed by one etching using the via hole photo resist layer and the trench photo resist layer as an etch mask, respectively.

9. The method of claim 1, wherein the via hole and the trench are formed in-situ.

10. The method of claim 1, further comprising performing an ashing process prior to filling the via hole and the trench with the metal thin film.

11. The method of claim 1, further comprising filling the via hole and the trench with a metal thin film to form a metal line.

* * * * *